United States Patent
Song et al.

(10) Patent No.: US 7,488,628 B2
(45) Date of Patent: Feb. 10, 2009

(54) METHODS FOR FABRICATING FERROELECTRIC MEMORY DEVICES WITH IMPROVED FERROELECTRIC PROPERTIES

(75) Inventors: Yoon-Jong Song, Seoul (KR); Nak-Won Jang, Seoul (KR); Ki-Nam Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 505 days.

(21) Appl. No.: 11/384,689

(22) Filed: Mar. 20, 2006

(65) Prior Publication Data

US 2006/0160252 A1 Jul. 20, 2006

Related U.S. Application Data

(62) Division of application No. 10/775,016, filed on Feb. 10, 2004, now Pat. No. 7,045,839.

(30) Foreign Application Priority Data

Feb. 10, 2003 (KR) .............................. 2003-08202

(51) Int. Cl.
  H01L 21/00 (2006.01)
  H01L 21/335 (2006.01)
  H01L 21/8232 (2006.01)
  H01L 21/8242 (2006.01)

(52) U.S. Cl. ..................... 438/142; 438/3; 438/240; 438/239; 438/253

(58) Field of Classification Search ............ 438/3, 438/240, 142, 785, 257
See application file for complete search history.

(56) References Cited

U.S. PATENT DOCUMENTS 5,119,154 A 6/1992 Gnadinger ............. 257/295
5,854,104 A 12/1998 Onishi et al. ............ 438/240
6,274,388 B1 * 8/2001 Aggarwal et al. .......... 438/3
6,406,971 B1 6/2002 Chien et al. ............. 438/398

(Continued)

FOREIGN PATENT DOCUMENTS

KR 1998-040642 8/1998

(Continued)

OTHER PUBLICATIONS

Notice to File Response, Korean Application No. 10-2003-0008202, mailed Dec. 17, 2004.

*Primary Examiner*—Chuong A. Luu
(74) *Attorney, Agent, or Firm*—Meyers Bigel Sibley & Sajovec (57) ABSTRACT

Pursuant to embodiments of the present invention, ferroelectric memory devices are provided which comprise a transistor that is provided on an active region in a semiconductor substrate, and a capacitor that has a bottom electrode, a capacitor-ferroelectric layer and a top electrode. These devices may further include at least one planarizing layer that is adjacent to the side surfaces of the bottom electrode such that the top surface of the planarizing layer(s) and the top surface of the bottom electrode form a planar surface. The capacitor-ferroelectric may be formed on this planar surface. The device may also include a plug that electrically connects the bottom electrode to a source-drain region of the transistor. The ferroelectric memory devices according to embodiments of the present invention may reduce ferroelectric degradation of the capacitor.

17 Claims, 10 Drawing Sheets

U.S. PATENT DOCUMENTS

| | | | |
|---|---|---|---|
| 6,555,864 B1 * | 4/2003 | Cross et al. | 257/310 |
| 6,583,460 B1 * | 6/2003 | Juengling | 257/296 |
| 6,709,875 B2 | 3/2004 | Gilbert et al. | 438/3 |
| 6,717,198 B2 | 4/2004 | Yoshikawa et al. | 257/295 |

FOREIGN PATENT DOCUMENTS

| | | |
|---|---|---|
| KR | 2002 0097479 | 12/2002 |

\* cited by examiner

Fig. 1

(PRIOR ART)

METHODS FOR FABRICATING FERROELECTRIC MEMORY DEVICES WITH IMPROVED FERROELECTRIC PROPERTIES

CROSS REFERENCE TO RELATED APPLICATIONS

This application claims the benefit of priority as a divisional application to U.S. patent application Ser. No. 10/775,016 filed Feb. 10, 2004, now U.S. Pat. No. 7,045,839 which claims priority under 35 U.S.C. § 119 to Korean Patent Application No. 2003-08202, filed Feb. 10, 2003, the contents of both of which are incorporated herein in their entirety by reference.

FIELD OF THE INVENTION

The present invention relates to semiconductor memory devices and, more particularly, to ferroelectric memory devices and methods for fabricating the same.

BACKGROUND OF THE INVENTION

Ferroelectric materials are materials in which, if an external voltage is applied to electric dipoles arranged in the material, a spontaneous polarization of the electric dipoles is generated. Application of a reverse external field to a ferroelectric material causes polarization of the electric dipoles in the opposite direction. Ferroelectric materials exhibit a hysteresis that is dependent on the magnitude and direction of the electric field. A memory device in which information is read or written from the device using the hysteresis of a ferroelectric material is referred to as a ferroelectric memory device. Typically, ferroelectric memory devices are non-volatile memory devices in which data can be retained even when power to the device is turned off.

A typical state of the art ferroelectric memory device is a non-volatile memory device that can be programmed using voltages of less than 5V. These devices typically are durable and do not consume much power—for example, they may draw less than 1 microampere of standby current. In light of these characteristics, ferroelectric memory devices have been regarded by many in the art as representing the next-generation of non-volatile memory devices. However, to achieve this status it is desirable to provide ferroelectric memory devices that are highly integrated.

A number of different cell structures for ferroelectric memory devices have been suggested to provide various of the characteristics that are desirable for next-generation non-volatile memory devices. For example, highly reliable ferroelectric memory devices have been proposed which have unit cells that comprise one transistor and one capacitor, a multi-layered line process, hot temperature retention, and read and write endurance.

In another approach, ferroelectric memory devices have been proposed that, similar to a DRAM memory device, include a transistor and a ferroelectric capacitor that are electrically interconnected. Such an approach is disclosed in U.S. Pat. No. 5,119,154 entitled "FERROELECTRIC CAPACITOR AND METHOD FOR FORMING LOCAL INTERCONNECTION" which is assigned to Micron Technology, Inc.

As noted above, achieving high-integration in a ferroelectric memory device is another important consideration. The degree of device integration sets a limit on the maximum size of the unit cells of the device. Two important processes for achieving such high integration are materialization of the one transistor-one capacitor structure and shrink-down technology for reducing the size of the ferroelectric capacitor.

Figure 1:
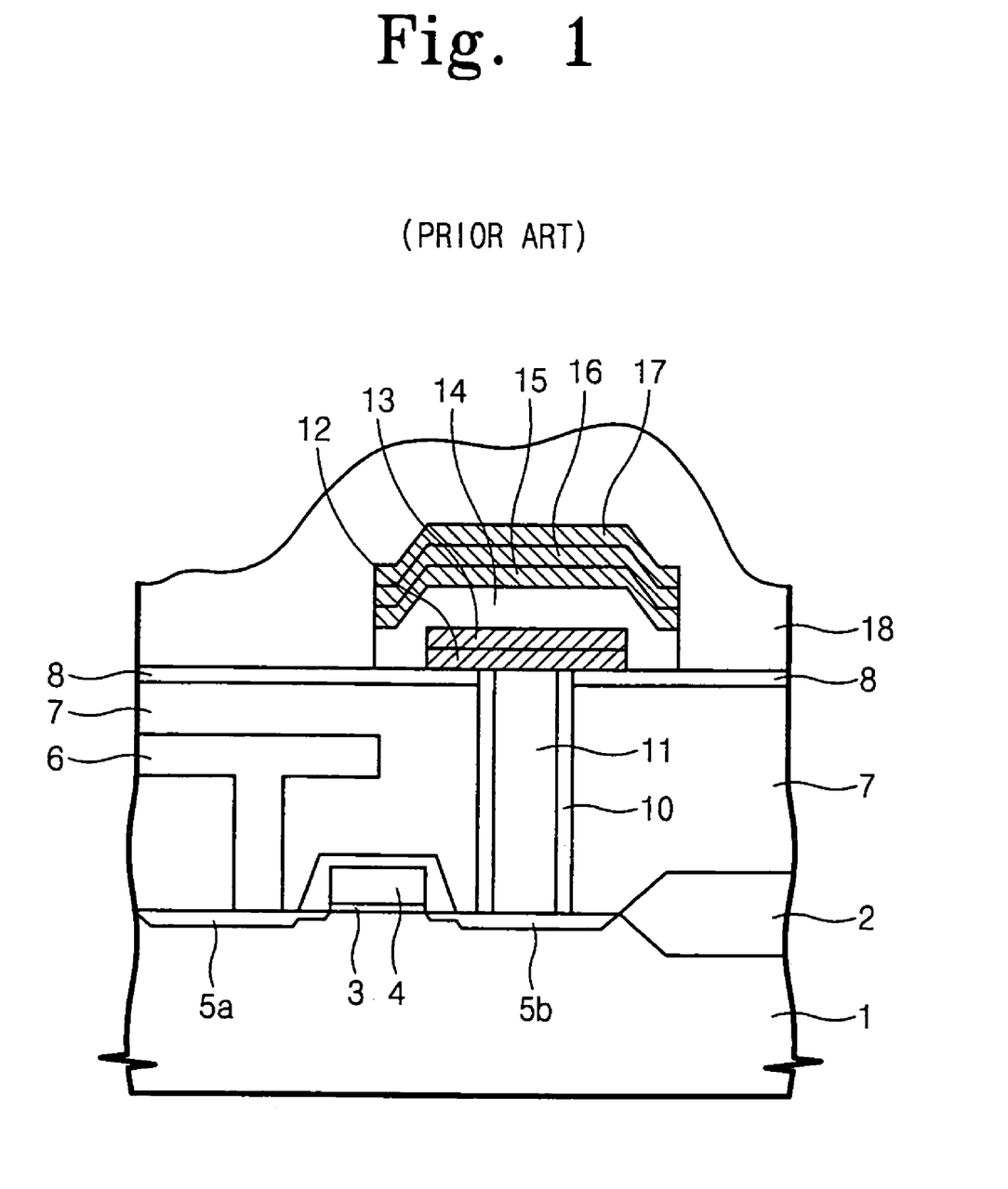
FIG. 1 is a cross-sectional view of a conventional ferroelectric memory device.

FIG. 1 illustrates a conventional method of connecting source/drain regions of the transistor in the unit cell of a ferroelectric memory device to the ferroelectric capacitor using a plug. The method of connecting the source/drain regions of the transistor to the ferroelectric capacitor using a plug that is illustrated in FIG. 1 is disclosed in U.S. Pat. No. 5,854,104 entitled "PROCESS FOR FABRICATING NON-VOLATILE SEMICONDUCTOR MEMORY DEVICE HAVING A FERROELECTRIC CAPACITOR" that is assigned to Sharp Inc.

The conventional ferroelectric memory device of FIG. 1 may be formed through the following steps. First, a transistor that includes a gate electrode 4 is formed in the semiconductor substrate 1. Next, an interlayer dielectric 7 is formed. Then a bottom electrode of a capacitor is formed as a TiN layer 12 and a Pt layer 13. Next, a capacitor ferroelectric 14 is formed, and the top electrode of the capacitor is formed by sequentially stacking a Pt layer 15, a TiN layer 16 and an alumina layer 17.

As shown in FIG. 1, the layers 12, 13 comprising the bottom electrode of the capacitor are electrically connected to a plug 11 that penetrates the interlayer dielectric 7. The semiconductor substrate 1 includes an isolation layer 2 and the gate electrode 4 of the transistor is in contact with a bit line 6. The drain region 5b in the semiconductor substrate is in contact with the plug 11. The device also includes a gate insulation layer 3, a diffusion prevention layer 8, a barrier 10 and an insulation layer 18.

The ferroelectric material of the dielectric of the capacitor is formed by depositing the ferroelectric material between the bottom electrode of the capacitor and the interlayer dielectric. The ferroelectric capacitor conventionally is formed using an etching process. In forming the capacitor ferroelectric, the ferroelectric material is typically deposited in non-crystalline state. A heat treatment is then applied that crystallizes the ferroelectric material.

SUMMARY OF THE INVENTION

Pursuant to some embodiments of the present invention, ferroelectric memory devices are provided which comprise a semiconductor substrate having a transistor thereon, a first interlayer dielectric, and a capacitor that has a bottom electrode, a capacitor-ferroelectric layer and a top electrode. A reaction buffer layer is provided between the first interlayer dielectric and the capacitor-ferroelectric layer. The device may also include a plug that penetrates the first interlayer dielectric and that is electrically connected to the capacitor.

The reaction buffer layer may be adjacent to the side surfaces of the bottom electrode, and the top surface of the reaction buffer layer and the top surface of the button electrode may form a planar surface. The capacitor-ferroelectric layer may be formed on this planar surface. The reaction buffer layer may be formed of a material that prevents a reaction between a third interlayer dielectric that is under the reaction buffer layer and the capacitor-ferroelectric layer such as, for example, titanium oxide, tantalum oxide or aluminum oxide. The device may also include a bit line that is on the first interlayer dielectric and a second interlayer dielectric that is on the first interlayer dielectric and the bit line. The third interlayer dielectric, if provided, may be recessed between the bottom electrode and a second bottom electrode associated with a capacitor of an adjacent ferroelectric memory device. If a third interlayer dielectric is provided, the reaction buffer layer may be on the third interlayer dielectric.

The bottom electrode of the device may be a three part structure that includes a first material that serves as an oxygen diffusion barrier, a second material that provides oxygen to the capacitor-ferroelectric layer and a third material that has a lattice point that allows for formation of a capacitor-ferroelectric layer having a crystalline structure. The top electrode may comprise a fourth material that provides oxygen to the capacitor-ferroelectric layer and a fifth material that is selected to improve the strength of the fourth material. In embodiments of the present invention, the first material may be iridium, the second material may be iridium oxide, the third material may be platinum, the fourth material may be iridium oxide and the fifth material may be iridium.

The ferroelectric memory devices may also include a first diffusion barrier that is on the first (or first and second) interlayer dielectric. This first diffusion barrier may be an oxygen diffusion barrier. The device may also include a second diffusion barrier on the capacitor-ferroelectric layer and on the top electrode which may act as a hydrogen diffusion barrier. This second diffusion barrier may, for example, comprise an aluminum oxide layer.

The device may also include a fourth interlayer dielectric on the top electrode, a first metal line on a part of the fourth interlayer dielectric, a fifth interlayer dielectric on the fourth interlayer dielectric, and a second metal line in a via hole that exposes the top surface of the top electrode. The first and second metal lines may each be formed of aluminum.

Pursuant to further embodiments of the present invention, ferroelectric memory devices are provided in which a transistor and a capacitor are provided on a semiconductor substrate. A first interlayer dielectric is provided on the semiconductor substrate so as to surround the gate electrode of the transistor, and the capacitor is provided on the first interlayer dielectric. The capacitor may include a buried bottom electrode that is on the first interlayer dielectric, a capacitor-ferroelectric layer that is provided on the buried bottom electrode and a top electrode that is on the capacitor-ferroelectric. The device further includes a planarizing layer that is adjacent to the side surfaces of the bottom electrode. The top surface of the planarizing layer and the top surface of the bottom electrode may form a planar surface onto which the capacitor-ferroelectric layer is formed. The device may also include a plug that penetrates the first interlayer dielectric under the bottom electrode, where the plug is electrically connected to the bottom electrode.

Pursuant to still further embodiments of the present invention, methods of fabricating ferroelectric memory devices are provided. In these methods, a transistor is formed on a semiconductor substrate. A first interlayer dielectric may then be formed on the semiconductor substrate and on the transistor. A buried plug is then formed that penetrates the first interlayer dielectric. A bottom electrode of a capacitor is formed on the buried plug and the first interlayer dielectric, and a third interlayer dielectric may be formed on the first interlayer dielectric. A top portion of the third interlayer dielectric may then be removed, and a reaction buffer layer may be formed on the third interlayer dielectric such that the side surfaces of the bottom electrode of the capacitor are covered by the reaction buffer layer. A capacitor-ferroelectric layer may then be formed on the reaction buffer layer and the bottom electrode, and the top electrode of the capacitor may then be formed on the capacitor-ferroelectric layer.

In these methods, the device may be fabricated such that the top surface of the reaction buffer layer and the top surface of the bottom electrode are the same height above the semiconductor substrate. A bit line may be formed on a part of the first interlayer dielectric and a second interlayer dielectric may be formed on the first interlayer dielectric before formation of the third interlayer dielectric. A first diffusion barrier may also be formed on the second interlayer dielectric and on at least the side surfaces of the bottom electrode after forming the bottom electrode. This diffusion barrier may be an oxygen diffusion barrier and may comprise an aluminum oxide layer.

In embodiments of the present invention, the bottom electrode is formed by depositing a first material that serves as an oxygen diffusion barrier on the first interlayer dielectric, depositing a second material that serves as an oxygen source for the capacitor-ferroelectric layer on the first material, and depositing a third material that has a suitable lattice point for formation of the capacitor-ferroelectric layer on the second material. The first material may be iridium, the second material may be iridium oxide and the third material may be platinum. The top electrode may be formed by depositing a fourth material on the capacitor-ferroelectric layer that provides the capacitor-ferroelectric layer with oxygen (such as iridium oxide) and then depositing a fifth material on the fourth material that enhances the strength of the fourth material (such as iridium).

In these methods the third interlayer dielectric may be formed by depositing a dielectric material on the second interlayer dielectric so as to cover the bottom electrode of the capacitor and then planarizing the dielectric material to expose the top surface of the bottom electrode. The top part of the planarized third interlayer dielectric may then be removed using an oxide etch-back process so that the top surface of the third interlayer dielectric is lower than the top surface of the bottom electrode. The reaction buffer layer may then be formed by depositing a pre-selected material on the third interlayer dielectric and the bottom electrode and then planarizing the top surface of the pre-selected material to expose the upper surface of the bottom electrode. The pre-selected material may be a material that shields the capacitor-ferroelectric layer from reacting with the third interlayer dielectric such as, for example, titanium oxide, tantalum oxide or aluminum oxide.

BRIEF DESCRIPTION OF THE DRAWINGS

FIGS. 4 through 15 are cross-sectional views illustrating operations for fabricating ferroelectric memory devices according to embodiments of the present invention.

DETAILED DESCRIPTION

The present invention will now be described more fully with reference to the accompanying drawings, in which examplary embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of the layers and regions are exaggerated for clarity. It will also be understood that when a layer or element is referred to as being "on" another layer or substrate, it can be directly on the other layer, element or substrate, or intervening layers and/or elements may also be present. In contrast, when a layer/element is referred to as being "directly on" another layer/element, there are no intervening layers or elements present. Likewise, when an element is described as being "between" two other elements it may be the only element between the two other elements or additional elements may also be present. Like numbers refer to like elements throughout the specification.

Figure 2:
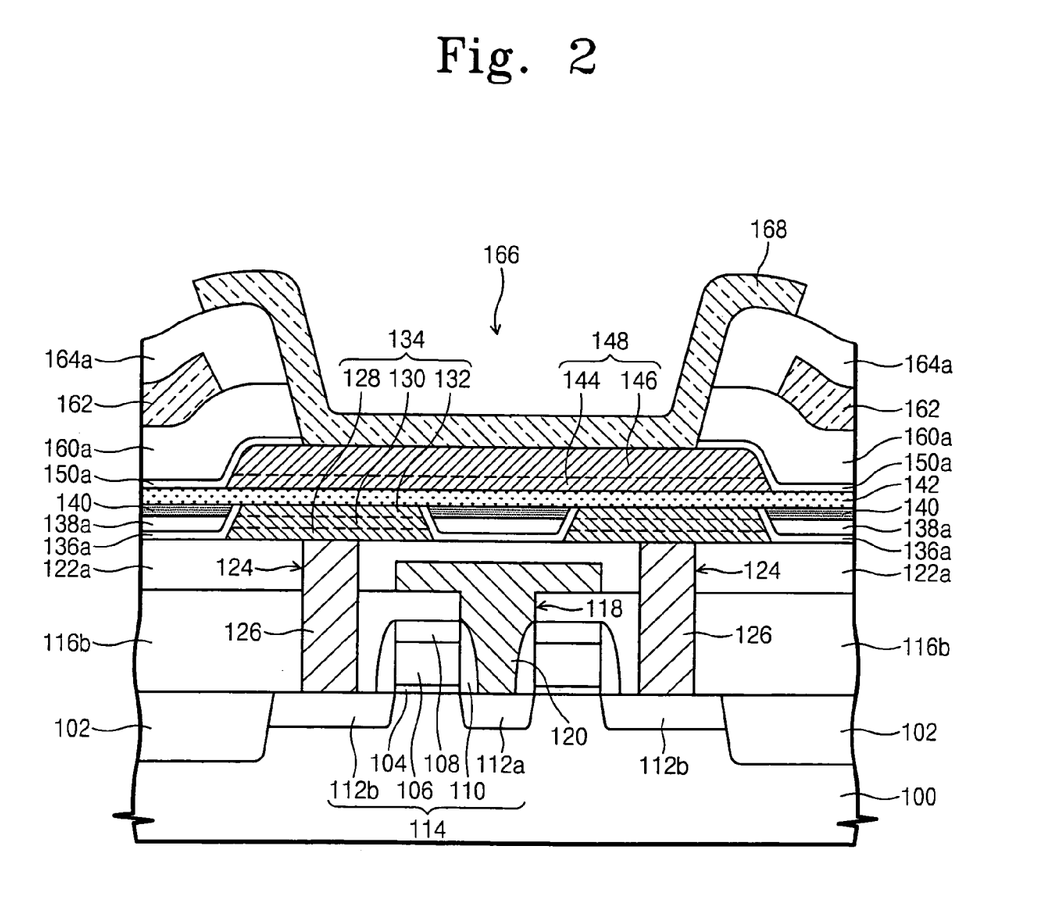
FIGS. 2 and 3 are cross-sectional views illustrating ferroelectric memory devices according to embodiments of the present invention.
Figure 3:
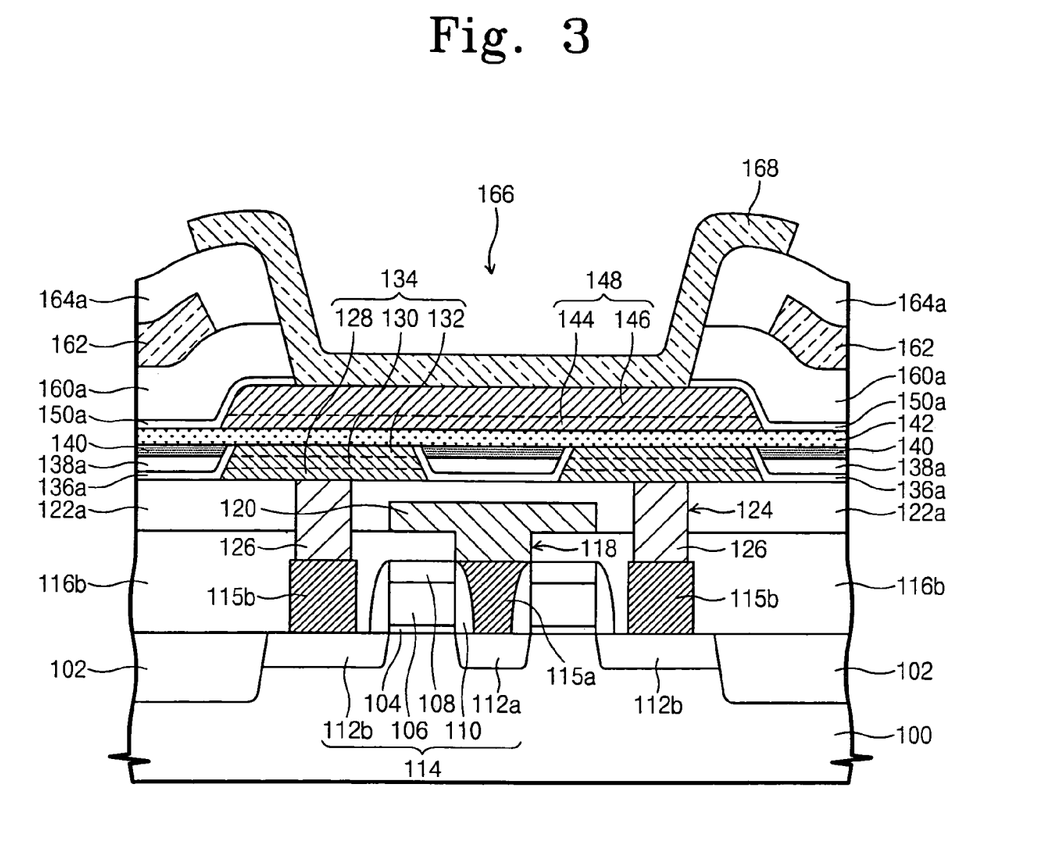

FIGS. 2 and 3 are cross-sectional views illustrating ferroelectric memory devices according to some embodiments of the present invention. FIGS. 4 through 15 are cross-sectional views illustrating steps for fabricating such ferroelectric memory devices.

The ferroelectric memory device shown in FIG. 2 includes a semiconductor substrate 100 which, for example, may comprise a silicon substrate. A transistor 114 is formed at an active region in the semiconductor substrate 100 that is defined by an isolation layer 102. The transistor 114 includes a source region 112a, a drain region 112b, a gate insulation layer 104, a gate electrode 106 and a hard mask layer 108. As shown in FIG. 2, the gate insulation layer 104, the gate electrode 106 and the hard mask layer 108 may be sequentially stacked on the active region in the semiconductor substrate 100. Gate spacers 110 may be formed on both sides of the transistor 114. The source region 112a and/or the drain region 112b may be formed by implanting impurities in the semiconductor substrate 100. The transistor 114 may take on different forms than the exemplary transistor depicted in FIG. 2.

The semiconductor substrate 100 includes a first interlayer dielectric 116b that may, for example, comprise a silicon oxide layer, and a second interlayer dielectric 122a that is sequentially stacked on the first interlayer dielectric 116b. A bit line 120 is formed on the top surface of the first interlayer dielectric 116b. A portion of the bit line 120 is buried within a first contact hole 118 that penetrates the first interlayer dielectric 116b so that the bit line 120 is electrically connected to the source region 112a of the semiconductor substrate 100. Additionally, a bottom electrode 134 of a capacitor, a capacitor-ferroelectric 142 and a top electrode 148 of the capacitor are formed on the second interlayer dielectric 122a. The bottom electrode 134, the capacitor ferroelectric layer 142, and the top electrode 148 may be formed sequentially.

As shown in FIG. 2, the bottom electrode 134 of the capacitor is electrically connected to the drain region 112b of the semiconductor substrate 100 through a buried plug 126. The buried plug 126 is formed within a second contact hole 124 that penetrates both the second interlayer dielectric 122a and the first interlayer dielectric 116b.

The buried bottom electrode 134 may include a first material 128, a second material 130 and a third material 132 that are stacked sequentially. The first material 128 may be in direct contact with the buried plug 126 and may be designed to prevent oxygen diffusion. The second material 130 may be selected as a material that provides oxygen to the ferroelectric layer 142. The third material 132 may be used to provide a suitable lattice point to form the capacitor-ferroelectric layer 142.

The first material 128 may, for example, be a non-oxidized, conductive material that retains its conductive property even if it is exposed to oxygen. The first material 128 may be a material that minimizes or prevents diffusion of oxygen to the buried plug 126 which could result in the formation of an oxide material that may raise the contact resistance of the plug 126. In embodiments of the present invention, the first material 128 may be iridium. Other examples of acceptable materials which may be used to form the first material 128 are noble metals, such as ruthenium and osmium.

The second material 130 may be a material that provides oxygen to the ferroelectric layer 142, which may improve the fatigue property of the ferroelectric memory device. By way of example, in embodiments of the present invention the second material 130 may be iridium oxide $IrO_2$. The third material 132 may be any material that provides a suitable lattice point for forming the ferroelectric via heat treatment with a Perovskite crystal structure that includes a permanent electrical dipole such as, for example, platinum.

As shown in FIG. 2, a first diffusion barrier 136a may also be formed on both sides of the buried bottom electrode 134 of the capacitor and on the second interlayer dielectric 122a. The first diffusion barrier 136a may serve to minimize and/or prevent oxidation of the buried plug 126 from oxygen diffusion through the bottom electrode 134. The first diffusion barrier 136a may, for example, be formed of aluminum oxide, titanium oxide, zirconium oxide or cesium oxide to prevent diffusion of oxygen into the bottom electrode 134.

A recessed third interlayer dielectric 138a is formed on the first diffusion barrier 136. The top surface of the third interlayer dielectric 138a may be lower than the top surface of the bottom electrode 134. The top surface of the bottom electrode 134 may initially be covered by the third interlayer dielectric 138a when the third interlayer dielectric 138 is formed.

A reaction buffer layer 140 may then be formed on the third interlayer dielectric 138a. The material used to form the reaction buffer layer may be a material that prevents products of Pyrochlore Phase, which may arise as a result of a reaction between the third interlayer dielectric (which may, for example, be a silicon oxide layer) and the capacitor-ferroelectric layer 142. The reaction buffer layer 140 may be formed, for example, of at least one material selected from the group consisting of titanium oxide, tantalum oxide and aluminum oxide. The buried bottom electrode 134 and the reaction buffer layer 140 may then be planarized and the capacitor-ferroelectric 142 may be deposited on this planarized surface. Since the capacitor-ferroelectric 142 is deposited uniformly, lifting problems that can impact the capacitor-ferroelectric layer in conventional ferroelectric memory devices may be minimized or prevented altogether. Additionally, the capacitor-ferroelectric layer 142 may be formed across the entire planarized surface so that there is no need for the etching processes that are used in fabricating conventional ferroelectric memory devices. These etching processes can cause etching damage that degrades the ferroelectric properties of the ferroelectric material. In embodiments of the present invention, this etch damage to the capacitor-ferroelectric 142 may be avoided. The capacitor-ferroelectric layer 142 may be formed of a wide variety of ferroelectric materials, such as, for example, lead zirconium titanate (PZT), strontium barium tantalate (SBT), and/or strontium barium tantalum titanate (SBTT).

The top electrode 148 of the capacitor is formed on the capacitor-ferroelectric 142. The top electrode 148 may comprise a two layered stacked structure that includes a fourth material 144 and a fifth material 146 that are deposited sequentially. The fourth material 144, which may be the lower of the two layers, may serve to provide oxygen to the capacitor-ferroelectric 142 and may be formed, for example, of iridium oxide ($IrO_2$). In addition to providing oxygen to the capacitor-ferroelectric 142, the iridium oxide layer 144 may improve the fatigue properties of the ferroelectric memory device. However, when the fourth material 144 is formed of iridium oxide or various other materials it may be overly brittle in terms of machinery stiffness. Consequently, the fifth material 146 may be formed of a material such as iridium that complements the stiffness of the fourth material 144.

As is also illustrated in FIG. 2, a second diffusion barrier 150a may optionally be formed across the surface of the top electrode 148 and the capacitor-ferroelectric 142. The second diffusion barrier 150a may be formed of a material that minimizes or prevents diffusion of hydrogen such as, for example, aluminum oxide, because hydrogen can reduce the ferroelectric properties of the capacitor-ferroelectric 142.

As shown in FIG. 2, a fourth interlayer dielectric 160a and a fifth interlayer dielectric 164a may be deposited sequentially on the top surface of the top electrode 148. A first metal line 162 that is made of, for example, aluminum, may be deposited on a predetermined part of the fourth interlayer dielectric, and a second metal line 168 may be formed within a via hole that is formed by selectively removing portions of the fourth interlayer dielectric 160a and the fifth interlayer dielectric 164a. The second metal line 168 may be formed of aluminum or the like so as to be electrically connected to the top electrode 148. The second metal line 168 may be referred to as a plate line.

FIG. 3 is a cross section of a ferroelectric memory device according to further embodiments of the present invention. In the embodiment of FIG. 3, the bit line 120 is electrically connected to the source region 112a of the semiconductor substrate through a first contact pad 115a. The first contact pad 115a may be formed, for example, of polysilicon or the like. In the embodiment of FIG. 3, the buried plug 126 is connected to the drain region 112b of the semiconductor substrate through a second contact pad 115b. The second contact pad may also be formed, for example, of polysilicon or the like.

In ferroelectric memory devices according to the embodiments of the present invention discussed above, the bottom electrode 134 of the capacitor is surrounded by the third interlayer dielectric 138a and the reaction buffer layer 140. There is little or no step difference between the bottom electrode 134 and the reaction buffer layer 140 and the capacitor-ferroelectric 142 may be uniformly formed on the planarized surface comprising the bottom electrode 134 and the reaction buffer layer 140. The capacitor-ferroelectric layer 142 need not be etched to form individual capacitors, so that etching damage can be reduced or eliminated.

FIGS. 4 through 15 illustrate methods of fabricating ferroelectric memory device according to embodiments of the present invention.

Figure 4:
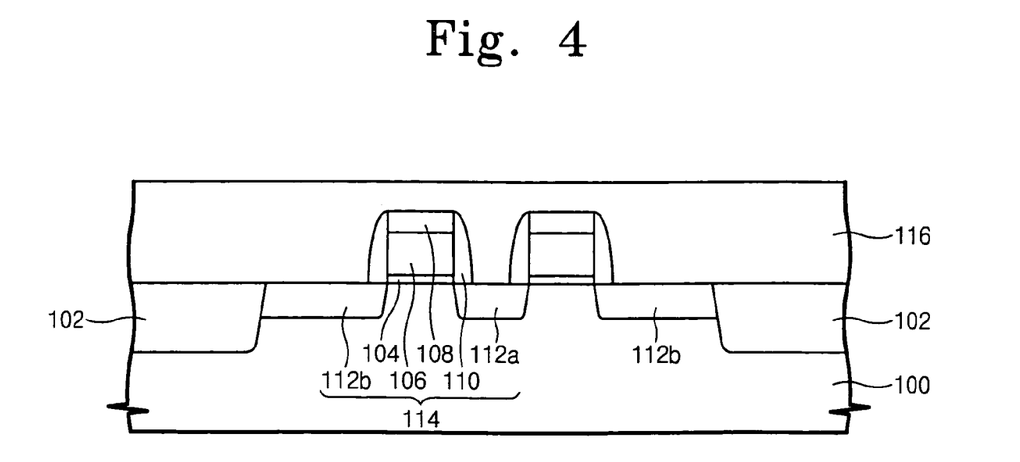

As shown in FIG. 4, in the methods of forming the ferroelectric memory devices of the present invention, a semiconductor substrate 100 which may, for example, comprise a silicon substrate is first prepared. An isolation layer 102 may then be formed on a predetermined region of the semiconductor substrate 100 using conventional techniques, such as local oxide methods or trench formation methods. The trench formation method may be particularly suitable for use in fabricating highly integrated ferroelectric memory devices. The isolation layers 102 serve to define one or more active regions in the semiconductor substrate 100 where various components (e.g., transistors) may be formed.

As is illustrated in FIG. 4, a transistor 114 may be formed at the active region of the semiconductor substrate 100. The transistor 114 may be formed by sequentially forming a gate insulation layer 104, a gate electrode 106, a hard mask layer 108 and a gate spacer 110. The transistor 114 further includes a source region 112a and a drain region 112b that are formed in the semiconductor substrate 100. The transistor 114 may include additional components, such as, for example a Lightly Doped Drain (LDD) region and/or a double gate spacer. It also will be appreciated by those of skill in the art that the transistor 114 may be embodied in various forms, and that the present invention is not limited to the specific embodiments depicted in the figures hereto. By way of example, the hard mask layer 108 depicted in FIG. 4 need not be included.

As is also shown in FIG. 4, next a first interlayer dielectric 116 may be formed on the semiconductor substrate 100 that includes the transistor 114. The first interlayer dielectric 116 may be formed of an insulation material, such as silicon oxide, using conventional chemical vapor deposition techniques. Typically, the first interlayer dielectric 116 will be deposited to a thickness sufficient to completely cover the transistor 114.

Figure 5:
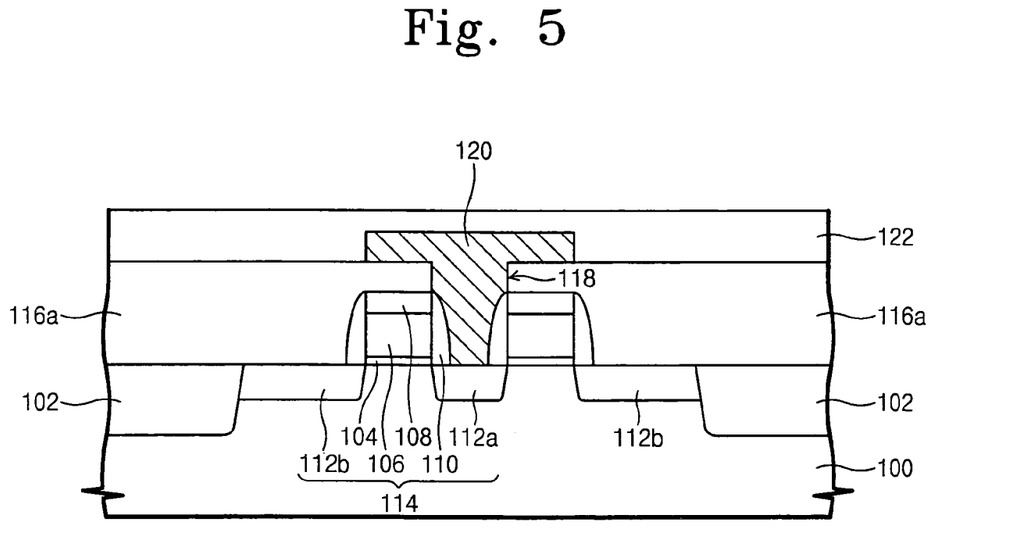

Next, as shown in FIG. 5, a bit line 120 is formed. The bit line 120 serves as a data line in the ferroelectric memory device. As shown in FIG. 5, the bit line 120 penetrates the first interlayer dielectric 116 to connect to the source region 112a of the semiconductor substrate 100. The bit line 120 may be formed as follows. First, an anisotropic etching process, such as plasma wet etching, may be used to selectively remove the first interlayer dielectric 116 so as to form a first contact hole 118 that exposes the source region 112a of the semiconductor substrate 100. The first contact hole 118 may then be filled with a conductive metal material such as polysilicon or tungsten. Then, the bit line 120 may be formed via a patterning process.

Next, a second interlayer dielectric 122 may be formed on the first interlayer dielectric and the bit line 120. The second interlayer dielectric 122 may be formed, for example, by using CVD to deposit an insulation material, such as silicon oxide, on the first interlayer dielectric 116a to a sufficient thickness to cover the bit line 120 completely.

Figure 6:
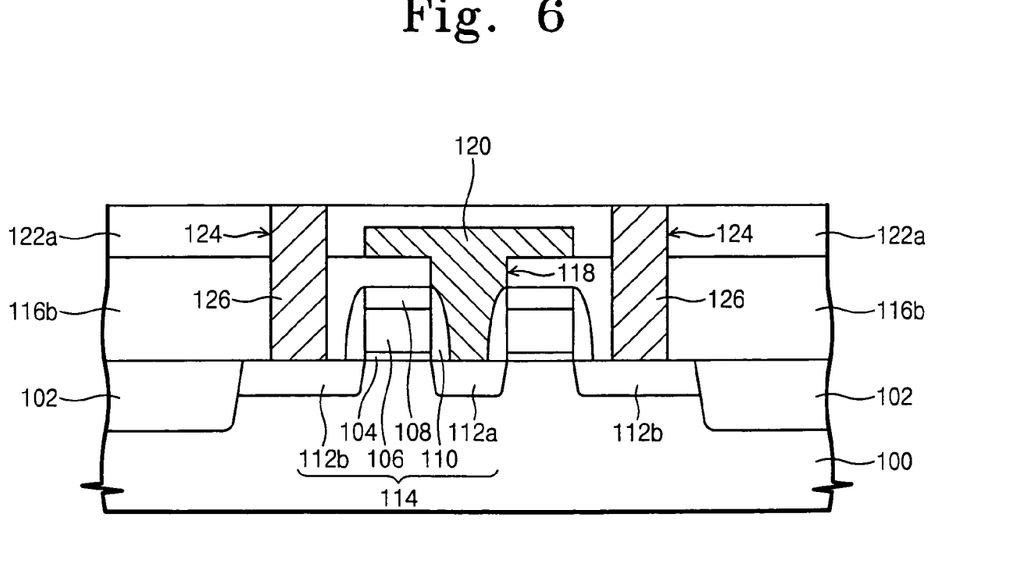

As shown in FIG. 6, the second interlayer dielectric 122 and the first interlayer dielectric 116a may then be selectively removed using an anisotropic etching method, such as plasma wet etching, to form a second contact hole 124 that exposes the drain region 112b of the semiconductor substrate 100. The second contact hole 124 may then be filled with a metal conductive material, such as polysilicon, tungsten or the like to form a buried plug 126.

Figure 7:
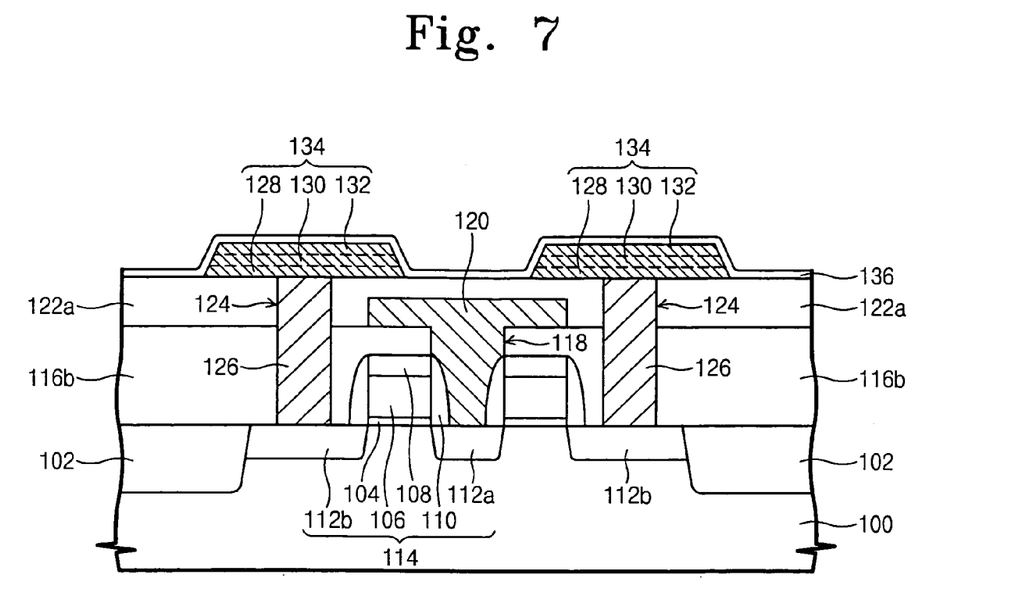

Next, as shown in FIG. 7, the bottom electrode 134 of a capacitor may be formed by sequentially depositing a first material 128, a second material 130 and a third material 132. The first material 128 may be selected to prevent diffusion of oxygen into the second interlayer dielectric 122a and/or the buried plug 126. The second material 130 may be selected to provide oxygen to the capacitor-ferroelectric 142 (see FIG. 11) as described herein. The third material 132 may be selected to provide a suitable lattice point to stably form the capacitor-ferroelectric 142 as described herein. The third material 132 and the second material 130 are selectively removed to form the bottom electrode 134. As shown in FIG. 7, the bottom electrode 134 is electrically connected to the buried plug 126.

The third material 132 included in the bottom electrode 134 may be platinum, which is resistant to heat and oxidation. As discussed herein, formation of the capacitor-ferroelectric 142 (see FIG. 11) may include a processing step in which a heat treatment is applied in an oxygen ambient. By forming the layer 132 as a platinum layer, excellent resistance to the heat and oxidation may be provided, but oxygen may tend to diffuse through the platinum layer 132, thereby oxidizing the buried plug 126. As the buried plug 126 may be formed of polysilicon, tungsten or the like, this oxidation may result in formation of a non-conductive polysilicon oxide or tungsten oxide region at the interfaces between the bottom electrode 134 and the buried plug 126. Such regions may increase the contact resistance of the device which, in turn, may cause the device to not function properly.

To minimize and/or prevent such oxidation of the contact plug 126, the first material 128 of the bottom electrode 134 may comprise a non-oxidized conductive material that (1) maintains its conductive state even if oxidized and (2) oxygen cannot diffuse through. By way of example, the first material 128 may be iridium or perhaps a noble metal, such as ruthenium or osmium.

Ferroelectric memory devices that use platinum as an electrode material may exhibit a fatigue phenomenon whereby the residual polarization of the device may be reduced with increasing usage of the device. According to some embodiments of the present invention, the second material 130 of the bottom electrode 134 may comprise a material that provides oxygen to the capacitor-ferroelectric 142 which, as discussed herein, may improve the fatigue characteristics of the device. As described later, voids may be formed within the capacitor-ferroelectric 142 if insufficient oxygen is provided during formation of the capacitor-ferroelectric layer. If enough such voids are formed within the capacitor-ferroelectric 142, the data retention property of the capacitor may be reduced. By forming the second material 130 of a material, such as iridium oxide, that is capable of providing oxygen to the capacitor-ferroelectric 142, the number of voids formed with the capacitor ferroelectric 142 may be reduced.

Figure 11:
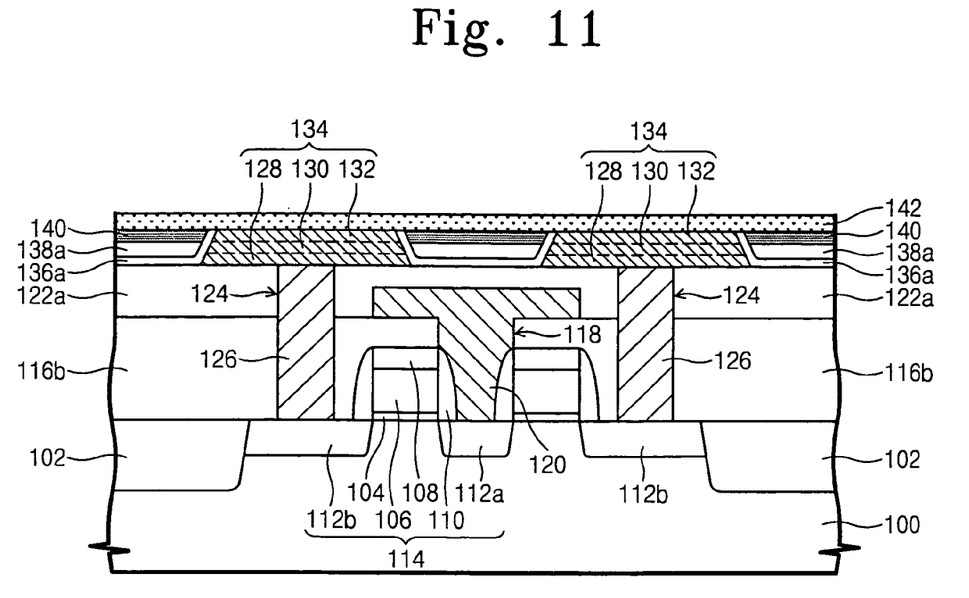

As shown in FIG. 11, a ferroelectric material may next be deposited on the bottom electrode 134, and the capacitor-ferroelectric may then be formed by heat treating the ferroelectric material to form a Perovskite structure that includes a permanent electrical dipole. To facilitate this, the third material 132 of the bottom electrode 134 may comprise a platinum layer, as platinum has a suitable lattice point that allows stable formation of the capacitor-ferroelectric 142 on the bottom electrode 134.

In some embodiments of the present invention, after forming the bottom electrode 134, a first diffusion barrier 136 may be formed that covers the bottom electrodes 134 and the second interlayer dielectric 122a. As discussed above, if the buried plug 126 is oxidized by oxygen that diffuses through the bottom electrode 134, the contact resistance of the plug 126 may be raised. To minimize and/or prevent this, the first diffusion barrier 136 may be formed in a capsule shape on the bottom electrode 134. The first diffusion barrier 136 may be formed, for example, of aluminum oxide, titanium oxide, zirconium oxide and/or cesium oxide, which are materials that offer resistance to oxygen diffusion.

Figure 8:
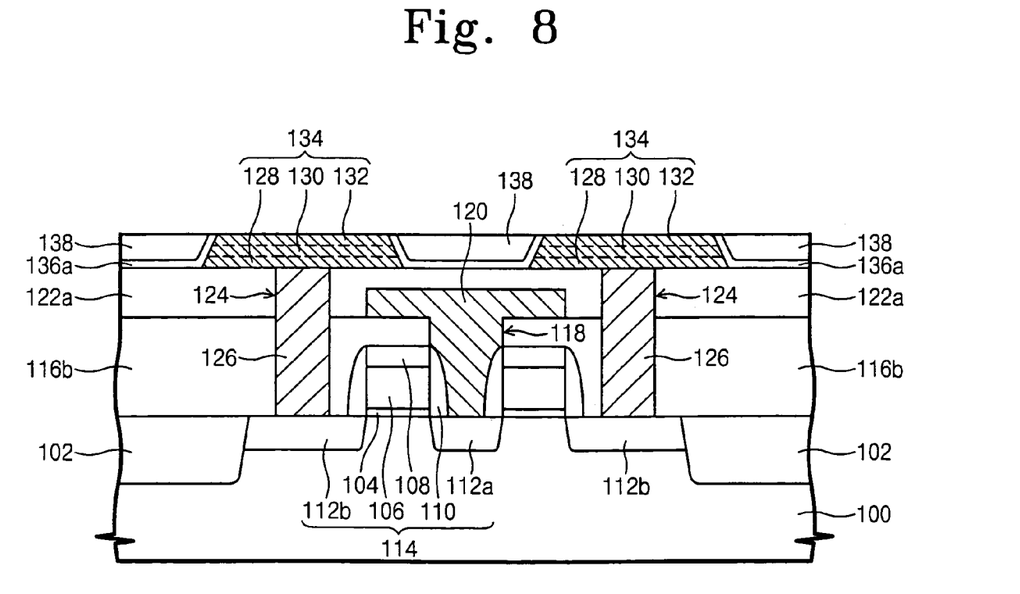

Next, as shown in FIG. 8, a third interlayer dielectric 138 may be formed on the second interlayer dielectric 122a. The third interlayer dielectric 138 may be formed by depositing an insulation layer, such as a silicon oxide layer, on the bottom electrodes 134 and the first diffusion barrier 136. The insulation layer may then be planarized using a CMP process to form the third interlayer dielectric 138. As shown in FIG. 8, this planarization process exposes the top surface of the bottom electrode 134. The portion of the first diffusion barrier 136 that was formed on the top surface of the bottom electrode 134 may also be removed in the planarization process.

Figure 9:
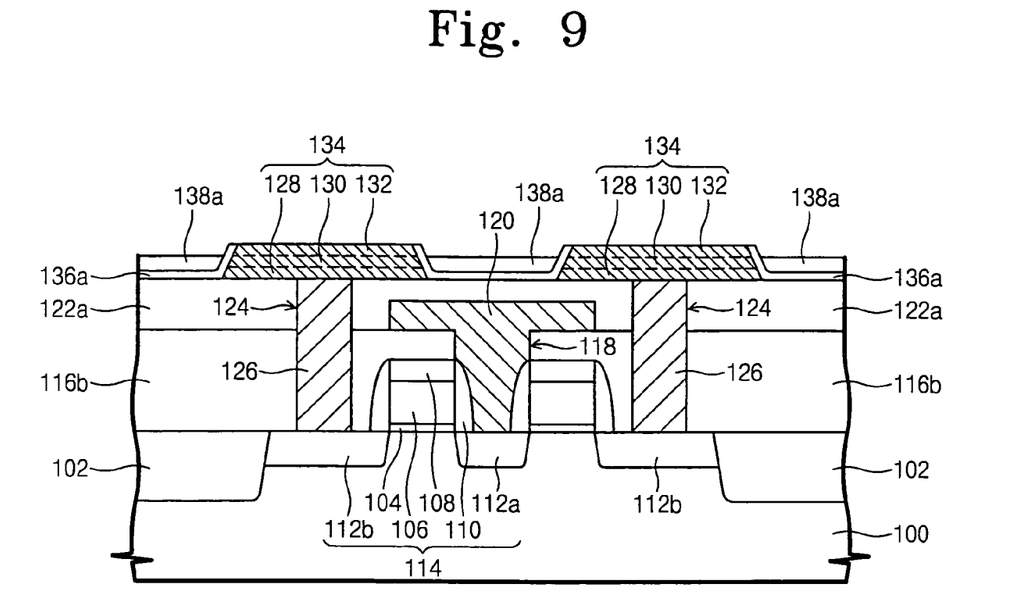

The third interlayer dielectric 138 may be formed via an oxide etch-back process. As shown in FIG. 9, the top surface of the third interlayer dielectric 138 may then be removed to a predetermined thickness. The remaining portion of the third interlayer dielectric, which is labeled 138a in FIG. 9, has a recessed shape such that the top surface of the third interlayer dielectric 138a is lower than the top surface of the bottom electrode 134.

Figure 10:
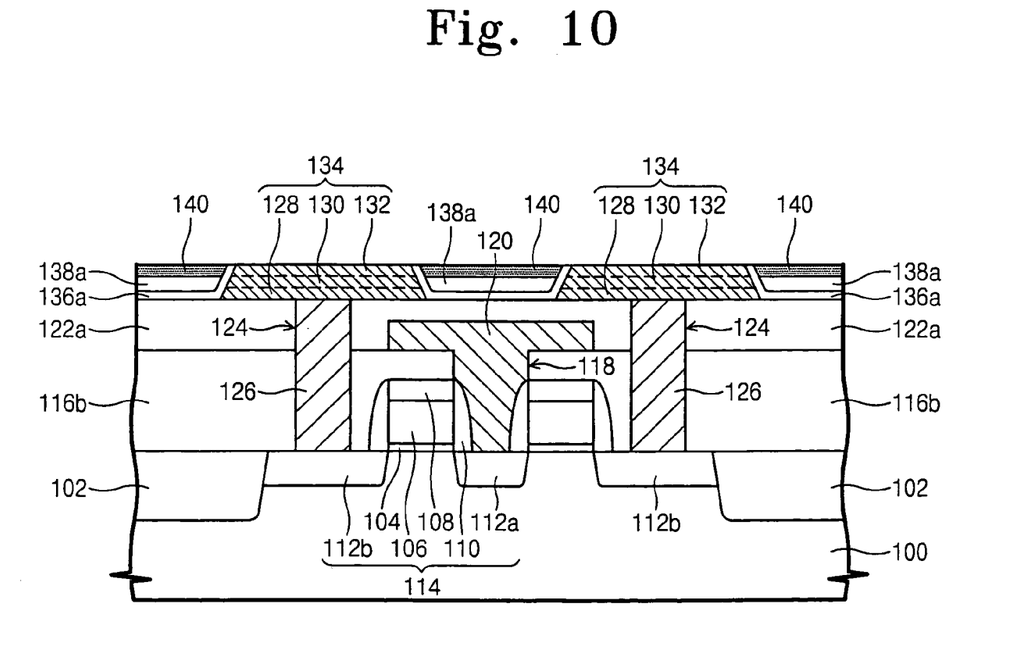

As shown in FIG. 10, a reaction buffer layer 140 may then be formed on the third interlayer dielectric 138a such that the top surface of the reaction buffer layer 140 is coplanar with the top surface of the bottom electrode 134. As a result, only the top surface of the buried bottom electrode 134 is exposed, as the third interlayer dielectric 138a and the reaction buffer layer 140 surround the sides of the bottom capacitor 134.

As discussed in more detail herein, to form the capacitor-ferroelectric layer 142 (see FIG. 11), a ferroelectric material is deposited in a non-crystalline state on the reaction buffer layer 140 and the bottom electrode 134. Then, a heat treatment may be applied in, for example, an oxygen ambient, so that the ferroelectric material is transformed to have a crystalline structure that includes a permanent electric dipole, which is referred to as a perovskite. Where the heat treatment is performed after the ferroelectric material is deposited on silicon oxide (e.g., the third interlayer dielectric 138a), Pyrochlore phase may be formed as a result of a reaction between the silicon oxide layer and the capacitor-ferroelectric layer 142. The reaction buffer layer 140 may be formed of a material that acts to reduce or eliminate this reaction.

The reaction buffer layer 140 can be formed as follows. The third interlayer dielectric 138a is selectively removed. A pre-selected material is deposited on the third interlayer dielectric 138a. The pre-selected material may be formed, for example, of one or more of titanium oxide, tantalum oxide and/or aluminum oxide, each of which act to minimize or prevent reaction between the third interlayer dielectric 138a and the capacitor-ferroelectric layer 142. The reaction buffer layer 140 may then be formed by planarizing the pre-selected material using, for example, CMP, to expose the top surface of the bottom electrode 134. In this manner, the reaction buffer layer 140 is formed on the third interlayer dielectric 138a such that deposition surface for the ferroelectric material is a planar surface.

As shown in FIG. 11, the capacitor-ferroelectric layer 142 may be formed next. Examples of materials that may be used to form the capacitor-ferroelectric 142 are lead zirconium titanate (PZT), strontium barium tantalate (SBT), and/or strontium barium tantalum titanate (SBTT). The capacitor-ferroelectric 142 can be formed as follows. First, a ferroelectric material is deposited on the reaction buffer layer 140 and the bottom electrode 134 in a non-crystalline state using, for example, the sol-gel coating method. Next, the capacitor-ferroeletric 142 is formed by heating the device to a high temperature in an oxygen ambient which transforms the ferroelectric material to have a ferroelectric crystalline structure (e.g., the Perovskite). As noted above, platinum may be used as the third material of the bottom electrode 134 to facilitate stably forming the lattice structure for the capacitor-ferroelectric 142.

As shown in FIG. 11, the capacitor-ferroelctric layer 142 and the third interlayer dielectric 138a are isolated from each other by the reaction buffer layer 140. This may facilitate reducing or eliminating undesirable Pyro-chlore Phase phenomenon. Also, as should be clear from the above, the capacitor-ferroelectric 142 may be formed without use of an etching process. As a result, etch damages to the capacitor-ferroelectric layer 142 may be minimized or avoided altogether.

Figure 12:
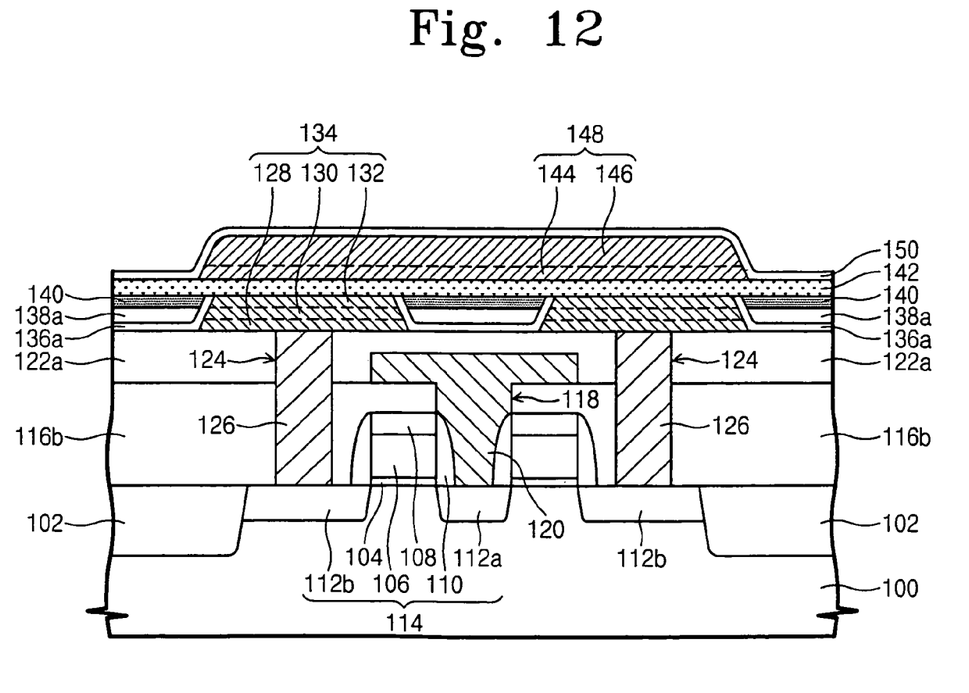

Next, as shown in FIG. 12, the top electrode 148 of the capacitor may be formed on the capacitor-ferroelectric 142. The top electrode 148 may be formed as follows. First, a fourth material 144 and a fifth material 146 may be sequentially deposited on the capacitor-ferroelectric 142. The fourth material 144 may be selected to provide oxygen to the capacitor-ferroelectric 142. The fifth material 146 may be selected to complement the machinery stiffness of the fourth material 144. Then, the top electrode 148 may be formed by selectively removing the fourth material 144 and the fifth material 146.

As previously mentioned, the fourth material 144 may be selected as iridium oxide which act as an oxygen source for the capacitor-ferroelectric 142, thereby improving the fatigue property of the capacitor-ferroelectric 142. However, iridium oxide has a brittleness property in an aspect of machinery stiffness. Accordingly, the fifth material 146 may be iridium which acts to reduce the above-mentioned brittleness problems when the fourth material 144 is formed of iridium oxide.

As is also shown in FIG. 12, a second diffusion barrier 150 may be formed across the top surface of the capacitor-ferroelectric 142. The second diffusion barrier 150 may be, formed, for example, of aluminum oxide so as to prevent hydrogen from diffusing into the capacitor-ferroelectric 142, as such hydrogen diffusion can reduce the ferroelectric properties of the ferroelectric material.

Figure 13:
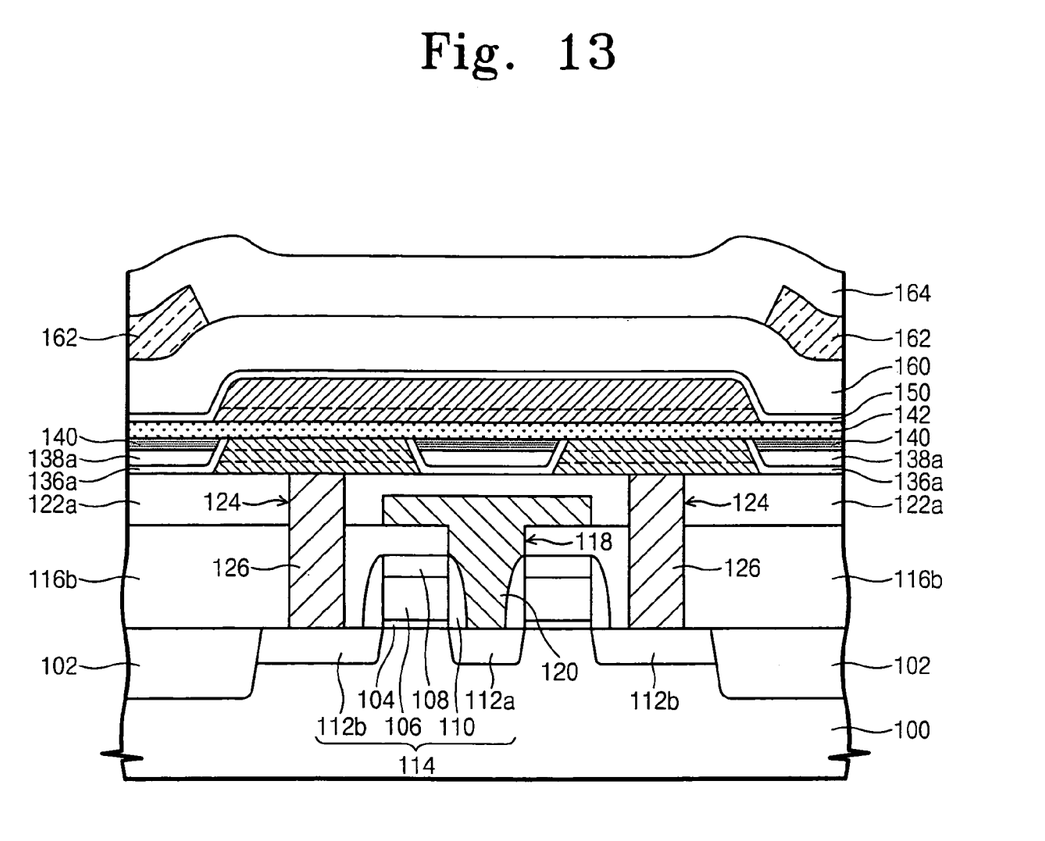

Next, as shown in FIG. 13, a fourth interlayer dielectric 160 may be formed to cover the second diffusion barrier 150. The fourth interlayer dielectric 160 may be formed by depositing silicon oxide using conventional CVD techniques. A first metal line 162 may then be formed by depositing a metal (e.g., aluminum) and patterning at a predetermined portion of the fourth interlayer dielectric 160. Next, a fifth interlayer dielectric 164 may be formed by depositing silicon oxide using conventional CVD techniques on the fourth interlayer dielectric 160 and the first metal line 162.

Figure 14:
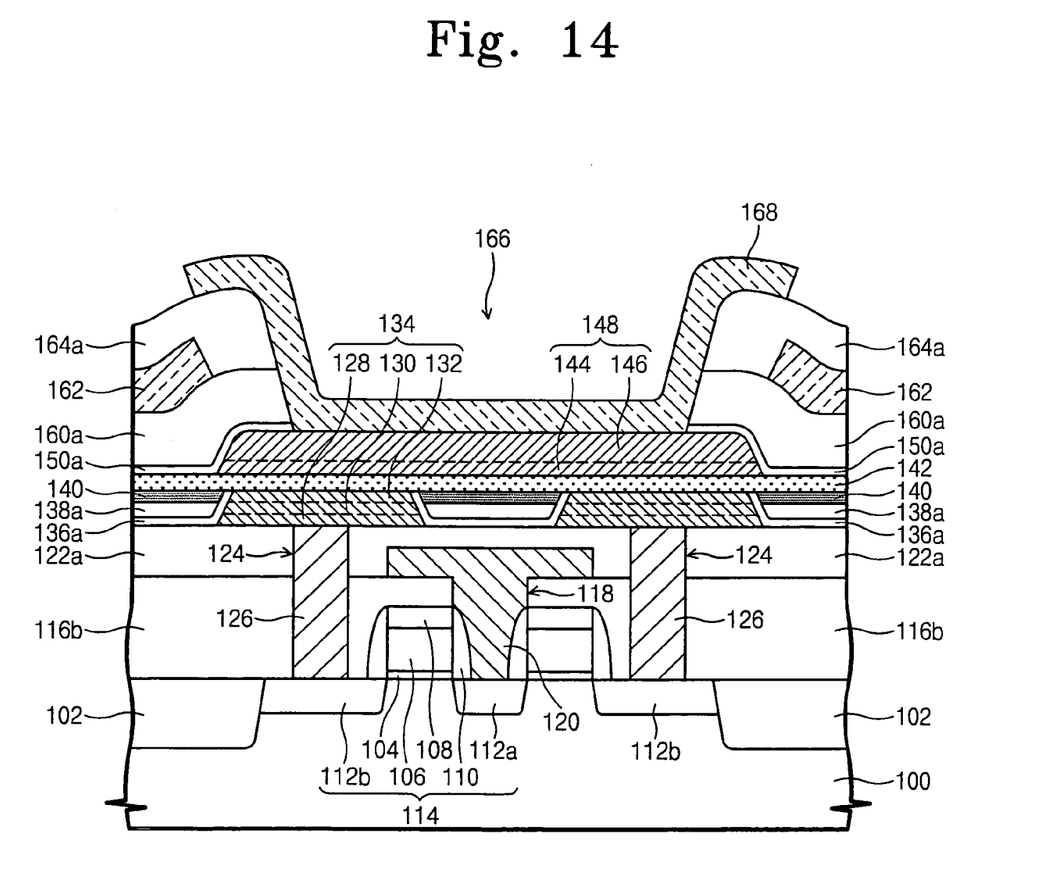

As shown in FIG. 14, a via hole 166 may then be formed by using an etching process to selectively remove the fifth interlayer dielectric 164, the fourth interlayer dielectric 160 and (if included) the second diffusion barrier 150 to expose the top surface of the top electrode 148 of the capacitor. In FIG. 14, the remaining portion of the fifth interlayer dielectric is labeled 164a and the remaining portion of the fourth interlayer dielectric is labeled 160a. In another approach, the top electrode 148 may act as an etch stop layer in an etching process that is used to form the via hole. After the via hole 166 is formed, a second metal line 168, which is sometimes referred to as a plate line, is formed on the top electrode 148. The second metal line 168 may be formed, for example, of aluminum.

The ferroelectric memory device may then be completed using conventional processing steps.

Figure 15:
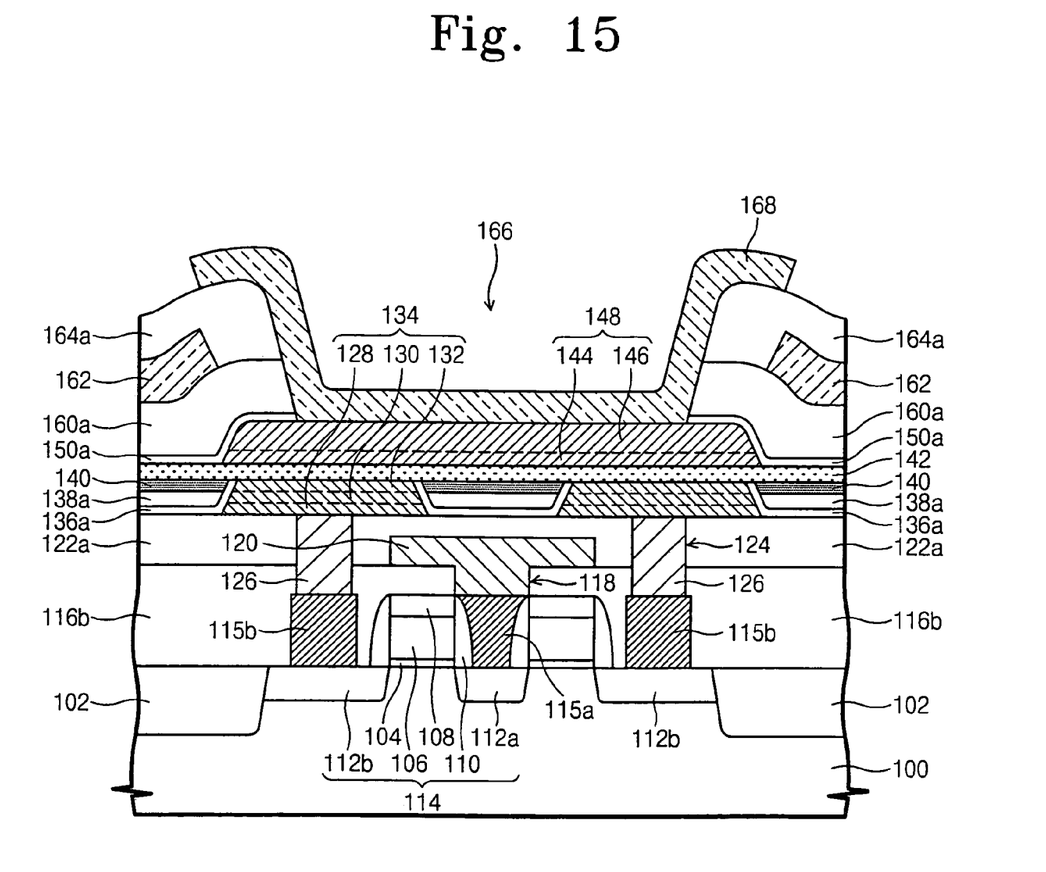

FIG. 15 illustrates ferroelectric memory devices according to further embodiments of the present invention. As shown in FIG. 15, a first contact pad 115a that is in contact with the source region 112a of the semiconductor substrate 100 may be formed by filling the first contact hole 118 with polysilicon before forming the bit line 120. In this manner, the bit line 120 may be electrically connected to the source region 112a through the first contact pad 115a. A second contact pad 115b may similarly be formed that is in contact with the drain region 112b of the semiconductor substrate 100 by filling the second contact hole 124 with polysilicon before forming the buried plug 126. In this manner, the buried plug 126 may be electrically connected to the drain region through the second contact pad 115b.

As discussed above, in embodiments of the present invention, the capacitor-ferroelectric is formed by depositing the ferroelectirc material on a planarized deposition surface, allowing uniform and conformal deposition of the ferroelectric material. Undesirable reaction between the ferroelectric material and the interlayer dielectric may also be reduced or prevented by provision of a reaction buffer layer. Furthermore, the capacitor-ferroelectric may be formed without an etching step thereby reducing or eliminating the possibility of etch damage. Accordingly, the electrical properties of the ferroelectric memory device may be improved.

Although exemplary embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method of fabricating a ferroelectric memory device, the method comprising:
   forming a transistor on a semiconductor substrate;
   forming a first interlayer dielectric on the semiconductor substrate and on the transistor;
   forming a buried plug that penetrates the first interlayer dielectric;
   forming a bottom electrode of a capacitor on the buried plug and the first interlayer dielectric;
   forming a third interlayer dielectric on the first interlayer dielectric;
   removing a top part of the third interlayer dielectric;
   forming a reaction buffer layer on the third interlayer dielectric so that the side surfaces of the bottom electrode of the capacitor are covered by the reaction buffer layer;
   forming a capacitor-ferroelectric layer on the reaction buffer layer and the bottom electrode; and
   forming a top electrode of the capacitor on the capacitor-ferroelectric layer.

2. The method of claim 1, further comprising:
   forming a bit line on a part of the first interlayer dielectric, the bit line being electrically connected to the substrate; and
   forming a second interlayer dielectric on the first interlayer dielectric before formation of the third interlayer dielectric.

3. The method of claim 2, further comprising forming a first diffusion barrier on the second interlayer dielectric and on at least the side surfaces of the bottom electrode after forming the bottom electrode.

4. The method of claim 3, wherein the first diffusion barrier comprises an oxygen diffusion barrier.

5. The method of claim 4, wherein the first diffusion barrier comprises an aluminum oxide layer.

6. The method of claim 1, wherein forming the bottom electrode comprises:
   depositing a first material that serves as an oxygen diffusion barrier on the first interlayer dielectric, depositing a second material that serves as an oxygen source for the capacitor-ferroelectric layer on the first material, and depositing a third material that has a suitable lattice point for formation of the capacitor-ferroelectric layer on the second material; and
   selectively removing the first, second and third materials to form the bottom electrode.

7. The method of claim 6, wherein the first material comprises iridium, the second material comprises iridium oxide and the third material comprises platinum.

8. The method of claim 2, wherein forming the third interlayer dielectric comprises:
   depositing a dielectric material on the second interlayer dielectric so as to cover the bottom electrode of the capacitor; and
   planarizing the dielectric material to expose the top surface of the bottom electrode.

9. The method of claim 8, wherein removing the top part of the third interlayer dielectric comprises removing the top part of the third interlayer dielectric that is adjacent to the bottom electrode using an oxide etch-back process so that the top surface of the third interlayer dielectric is lower than the top surface of the bottom electrode.

10. The method of claim 1, wherein forming the reaction buffer layer comprises:
   depositing a pre-selected material on the third interlayer dielectric and the bottom electrode; and
   planarizing the top surface of the pre-selected material to expose the upper surface of the bottom electrode.

11. The method of claim 10, wherein the pre-selected material is a material that shields the capacitor-ferroelectric layer from reacting with the third interlayer dielectric.

12. The method of claim 11, wherein the pre-selected material is at least one selected from the group consisting of titanium oxide, tantalum oxide and aluminum oxide.

13. The method of claim 1, wherein forming the top electrode comprises:
   depositing a fourth material on the capacitor-ferroelectric layer that provides the capacitor-ferroelectric layer with oxygen;
   depositing a fifth material on the fourth material that enhances the strength of the fourth material; and
   selectively removing the fourth and fifth materials.

14. The method of claim 13, wherein the fourth material comprises iridium oxide and the fifth material comprises iridium.

15. The method of claim 1, further comprising forming a hydrogen diffusion barrier on the top electrode and the capacitor-ferroelectric layer after forming the top electrode.

16. The method of claim 15, wherein the hydrogen diffusion barrier comprises an aluminum oxide layer.

17. The method of claim 1, further comprising:
   forming a fourth interlayer dielectric on the top electrode;
   forming a first metal line on a part of the fourth interlayer dielectric;
   forming a fifth interlayer dielectric on the fourth interlayer dielectric and the first metal line;
   selectively removing the fourth and fifth interlayer dielectrics to form a via hole that exposes a top surface of the top electrode; and
   forming a second metal line that is electrically connected to the top electrode in the via hole.

* * * * *

UNITED STATES PATENT AND TRADEMARK OFFICE
CERTIFICATE OF CORRECTION

PATENT NO. : 7,488,628 B2  Page 1 of 1
APPLICATION NO. : 11/384689
DATED : February 10, 2009
INVENTOR(S) : Song et al.

It is certified that error appears in the above-identified patent and that said Letters Patent is hereby corrected as shown below:

On Title Page:
Item 62, Related US Application Data, and Col. 1, line 3: Please correct the filing date of divisional application No. 10/775,016 "Feb. 10, 2004" to read -- Feb. 9, 2004 --

On the Title Page:
Item 74, Attorney, Agent, or Firm: Please correct "Meyers" to read -- Myers --

In the Claims:
Column 12, Claim 1, Line 27: Please delete "." after "ferroelectric layer." and please add -- ; wherein the top surface of the reaction buffer layer and the top surface of the bottom electrode are the same height above the semiconductor substrate. --

Signed and Sealed this

Seventh Day of April, 2009

JOHN DOLL
*Acting Director of the United States Patent and Trademark Office*